(12) United States Patent
Suyama

(10) Patent No.: US 9,435,850 B2
(45) Date of Patent: Sep. 6, 2016

(54) APPARATUS AND METHOD FOR POWER CYCLE TEST

(71) Applicant: Katsumasa Suyama, Osaka (JP)

(72) Inventor: Katsumasa Suyama, Osaka (JP)

(73) Assignee: ESPEC CORP., Osaka (JP)

( * ) Notice: Subject to any disclaimer, the term of this patent is extended or adjusted under 35 U.S.C. 154(b) by 245 days.

(21) Appl. No.: 13/945,757

(22) Filed: Jul. 18, 2013

(65) Prior Publication Data

US 2014/0021974 A1    Jan. 23, 2014

(30) Foreign Application Priority Data

Jul. 18, 2012   (JP) ................. 2012-159274

(51) Int. Cl.
*G01R 31/00*     (2006.01)
*G01R 31/26*     (2014.01)

(52) U.S. Cl.
CPC ....... *G01R 31/2619* (2013.01); *G01R 31/2642* (2013.01)

(58) Field of Classification Search
None
See application file for complete search history.

(56) References Cited

U.S. PATENT DOCUMENTS 5,815,385 A * 9/1998 Hyttinen et al. ................ 363/34

FOREIGN PATENT DOCUMENTS

| JP | 2010-245348 A | 10/2010 |
|----|---------------|---------|
| KR | 10-2010-0133302 A | 12/2010 |

* cited by examiner

*Primary Examiner* — Paresh Patel
(74) *Attorney, Agent, or Firm* — McDermott Will & Emery LLP

(57) ABSTRACT

Provided are a power cycle test apparatus and a power cycle test method that can efficiently reproduce nearly a level of stress that may occur in failure mode in actual environments, the apparatus which is a test apparatus for performing a power cycle test for a power semiconductor device to be tested by applying a thermal stress to the power semiconductor device through the application of a stress current thereto in predefined ON/OFF cycles executes a thermal cycle test in temperature rise-fall cycles longer than the ON/OFF cycles by using an apparatus configured to change an external environmental temperature and further executes the power cycle test while executing the thermal cycle test in synchronization with execution phases of the thermal cycle test.

12 Claims, 5 Drawing Sheets

*Power cycle need not be synchronized with temperature cycle.

Figure 1—Typical power and temperature cycle test condition

Test Method A 105C
(Revision of A 105B)

APPARATUS AND METHOD FOR POWER CYCLE TEST

FIELD OF THE INVENTION

The invention relates to power cycle test apparatuses for testing power semiconductor devices such as IGBT (Insulated Gate Bipolar Transistor), MOSFET, and power transistors, and further relates to power cycle test methods for the purpose.

DESCRIPTION OF THE RELATED ART

The lifetime of the power semiconductor device can be classified into two following aspects; one aspect is associated with thermal fatigue resulting from self-heating of the power semiconductor device, and another aspect is associated with thermal fatigue resulting from temperature changes in an external environment of the power semiconductor device. To predict the respective lifetimes, different types of tests are available; the power cycle test where a thermal stress is repeatedly applied in short cycles (power cycles) to junctions in the power semiconductor device to predict the lifetime associated with the former thermal fatigue, and thermal cycle test where environmental temperature is changed in cycles longer than the short cycles (thermal cycles) to predict the lifetime associated with the latter thermal fatigue.

As illustrated in FIG. 8, it is not demanded in the JEDEC standards (see the Non-Patent Reference 1) that the power cycles in the power cycle test should be synchronized with the thermal cycles. FIG. 8 is an illustration of power cycles of a power source used in the power cycle test and thermal cycles by a thermal stress in the thermal cycle test according to the JEDEC standards. More specifically describing "synchronize" in this context, these tests are carried out so that the power cycles are coincident with the phases of the thermal cycles.

RELATED ART DOCUMENT

Non-Patent Reference

[Non-Patent Reference 1] JEDEC STANDARD, Power and Temperature Cycling, JESD22A105C

SUMMARY OF THE INVENTION

Problems to be Solved by the Invention

Because it is unnecessary that the power cycles be synchronized with the thermal cycles according to the JEDEC standards, these two tests are conventionally carried out with no synchronization between the respective cycles by using a system where a power source for the power cycle test and a thermostatic chamber for the thermal cycle test are separately and independently controlled.

In the environments where the power semiconductor devices are actually used, however, the power semiconductor devices undergo thermal fatigue owing to self-heating and also undergo thermal fatigue owing to external temperature changes. Therefore, the prediction of lifetime can hardly be accurate unless the power cycle test is synchronized with the thermal cycle test.

Accordingly an object of the invention is to provide a power cycle test apparatus and a power cycle test method that allow the power cycle test to be carried out in synchronization with the thermal cycle test. The power cycle test apparatus and the power cycle test method provided by the invention can efficiently reproduce nearly a level of stress that may occur in failure mode in actual environments, thereby succeeding in evaluating the power semiconductor devices with a high reliability.

Means for Solving Problems

A power cycle test apparatus according to the invention is an apparatus for performing a power cycle test for a power semiconductor device to be tested by applying a thermal stress to the power semiconductor device through the application of a stress current thereto in predefined ON/OFF cycles. The power cycle test apparatus includes: a current source for applying a current to the power semiconductor device; a temperature changing device for changing a temperature in an external environment of the power semiconductor device; and a controller for controlling the power cycle test apparatus. The controller executes a thermal cycle test in temperature rise-fall cycles longer than the ON/OFF cycles by using the temperature changing device and further executes the power cycle test in synchronization with execution phases of the thermal cycle test while executing the thermal cycle test.

Preferably, the power cycle test is a power cycle test in which a period of time when the stress current is applied to the power semiconductor device in the ON/OFF cycles of the power cycle test and a period of time when the current application is suspended are fixed.

Preferably, the power cycle test is a power cycle test in which an upper-limit temperature value set based on a difference between upper-limit and lower-limit temperatures that should be applied to a junction in the power semiconductor device within the ON/OFF cycles of the power cycle test is used as a preset temperature value, and the stress current is applied until a junction temperature reaches the preset temperature value.

Preferably, the controller controls the execution of the power cycle test to be prioritized over the execution of the thermal cycle test or controls the execution of the thermal cycle test to be prioritized over the execution of the power cycle test.

Preferably, the controller controls the execution of the thermal cycle test to be prioritized over the execution of the power cycle test in the case where a fall of temperature of the power semiconductor device takes more time in the power cycle test than a temperature fall time of the power semiconductor device defined in the thermal cycle test owing to heat storage in the power semiconductor device.

Preferably, in the case where a temperature of the power semiconductor device fails to reach a target heating temperature within the thermal cycles in the thermal cycle test owing to a capacity of the apparatus configured to change the external environmental temperature, the controller temporarily stops further progression of the thermal cycles until the temperature reaches the target heating temperature.

A power cycle test method according to the invention is a power cycle test method for performing a power cycle test for a power semiconductor device to be tested by applying a thermal stress to the power semiconductor device through the application of a stress current thereto in predefined ON/OFF cycles. The power cycle test method includes: a first step in which a thermal cycle test is executed in temperature rise-fall cycles longer than the ON/OFF cycles by using a temperature changing device for changing an external environmental temperature; and a second step in which the power cycle test is executed in synchronization with execution phases of the thermal cycle test while the thermal cycle test is being executed.

Effect of the Invention

According to the invention, since the power cycle test is executed in synchronization with the execution phases of the thermal cycle test, it is possible to evaluate the reliability of the power semiconductor device in environments where the power semiconductor device is actually used.

DESCRIPTION OF EMBODIMENTS

A power cycle test apparatus and a power cycle test method according to an embodiment of the invention are described in detail referring to the accompanying drawings. In the description of the embodiment below, IGBT is given as an example of power semiconductor devices. However, the invention is not necessarily limited to IGBT but is also applicable to other power semiconductor devices such as MOSFET and power transistors.

Figure 1:
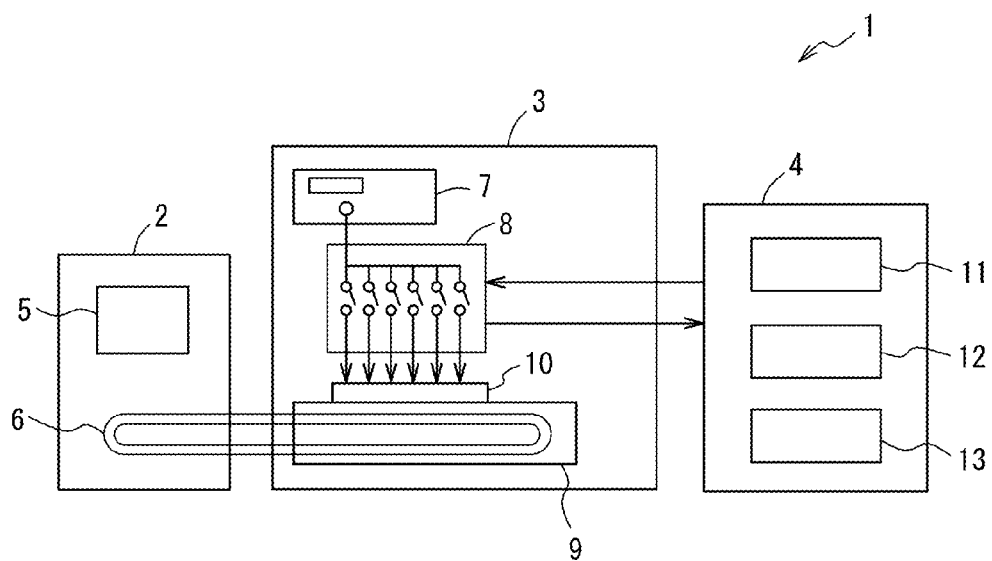
FIG. 1 is a block diagram illustrating a power cycle test apparatus according to an embodiment of the invention.
Figure 2:
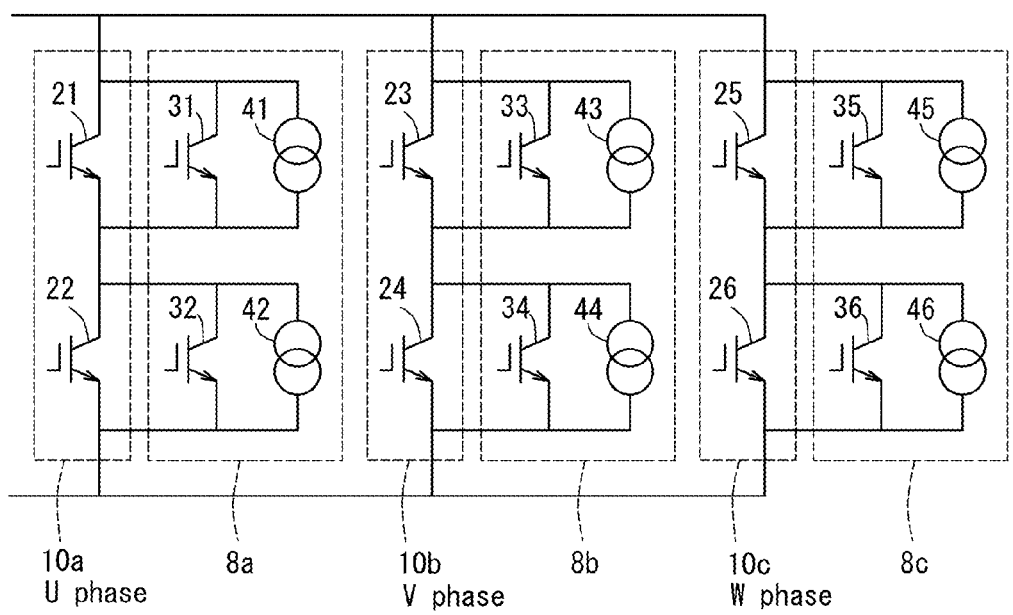
FIG. 2 is a circuit connection diagram, illustrating UVW three-phase IGBTs for test given as an example of test objects subjected to a power cycle test, IGBTs for control, and constant current sources.

First, the power cycle test apparatus according to the embodiment is described referring to FIGS. 1 and 2. A power cycle test apparatus 1 according to the embodiment has a chiller 2, a test unit 3, and a control rack 4.

The chiller 2 has a water temperature management unit 5 and a water circulation pipe 6. The temperature of water in the water circulation pipe 6 is controlled by the water temperature management unit 5 to stay in the range of minus 10° C. to plus 100° C., and the temperature-controlled water is supplied to a heating and cooling plate 9 of the test unit 3.

The test unit 3 includes a current source 7 that applies a current to IGBTs for test in a power device for test 10 to perform a power cycle test, and a power device for control 8 that controls whether a stress current is applied to the IGBTs for test in the power device for test 10 or the application of the stress current is suspended. The heating and cooling plate 9 of the test unit 3 is used to heat or cool the IGBTs for test in the power device for test 10 to perform a thermal cycle test. The power device for test 10 including a circuit connection illustrated in FIG. 2 is mounted on the heating and cooling plate 9.

The power device for test 10 includes UVW-phase IGBTs for test 21 to 26 illustrated in FIG. 2. In the power cycle test, the stress current is applied from the current source 7 to these IGBTs. In the thermal cycle test, these IGBTs are heated or cooled down by the heating and cooling plate 9.

The heating and cooling plate 9 is used as a device for causing temperature changes in an external environment of the power device for test 10.

The control rack 4 includes a computer for running control and operation programs described later. The control rack 4 further includes a controller 11, a gate timing unit 12, and a voltage measuring unit 13. The controller 11 controls and manages the whole power cycle test apparatus. The gate timing unit 12 decides a timing of applying an ON/OFF gate voltage to the IGBTs for test 21 to 26 and IGBTs for control 31 to 36 (see FIG. 2) in response to control commands outputted from the controller 11. The voltage measuring unit 13 measures collector-emitter voltages of the UVW-phase IGBTs for test 21 to 26 in response to measurement commands outputted from the controller 11.

The controller 11 controls ON/OFF timings of the UVW-phase IGBTs for test 21 to 26 in the power device for test 10 and the IGBTs for control 31 to 36 in the power device for control 8 by controlling the gate timing unit 12. Further, the controller 11 measures the collector-emitter voltages of the IGBTs for test 21 to 26 by controlling the voltage measuring unit 13.

The controller 11 controls the temperature of water in the water circulation pipe 6 by controlling the water temperature management unit 5 of the chiller 2 and feeds the heating and cooling plate 9 with the temperature-controlled water.

The IGBTs 21 to 26 illustrated in FIG. 2 are high-side and low-side IGBTs for test, and they are respectively UVW-phase IGBTs where collectors and emitters are serially connected to each other. These IGBTs for test 21 to 26 are each joined to a radiator plate which is a structural element provided in each IGBT, and the whole IGBTs are mounted on the heating and cooling plate 9 and provided as the power device for test 10 which is an example of three-phase inverters.

The power device for test 10 includes a U-phase power device unit for test 10a having high-side and low-side IGBTs for test 21 and 22, a V-phase power device unit for test 10b having high-side and low-side IGBTs for test 23 and 24, and a W-phase power device unit for test 10c having high-side and low-side IGBTs for test 25 and 26.

For the sake of simplifying the description, the power device for test 10 is thus divided in the U-phase power device unit for test 10a, V-phase power device unit for test 10b, and W-phase power device unit for test 10c.

The collector-emitter electrodes of IGBTs for control 31 and 32 are respectively connected in parallel to between the collector-emitter electrodes of the IGBTs for test 21 and 22 of the U-phase power device unit for test 10a. The collector-emitter electrodes of IGBTs for control 33 and 34 are respectively connected in parallel to between the collector-emitter electrodes of the IGBTs for test 23 and 24 of the V-phase power device unit for test 10b. The collector-emitter electrodes of IGBTs for control 35 and 36 are respectively connected in parallel to between the collector-emitter electrodes of the IGBTs for test 25 and 26 of the W-phase power device unit for test 10c.

Similarly, constant current sources 41 and 42 are respectively connected in parallel to between the collector-emitter electrodes of the IGBTs for test 21 and 22 of the U-phase power device unit for test 10a, constant current sources 43 and 44 are respectively connected in parallel to between the collector-emitter electrodes of the IGBTs for test 23 and 24 of the V-phase power device unit for test 10b, and constant current sources 45 and 46 are respectively connected in parallel to between the collector-emitter electrodes of the IGBTs for test 25 and 26 of the W-phase power device unit for test 10c.

The power device for control 8 includes the IGBTs for control 31 to 36 and the constant current sources 41 to 46. The IGBTs for control 31 and 32 and the constant current sources 41 and 42 constitute a U-phase power device unit for control 8a. The IGBTs for control 33 and 34 and the constant current sources 43 and 44 constitute a V-phase power device unit for control 8b. The IGBTs for control 35 and 36 and the constant current sources 45 and 46 constitute a W-phase power device unit for control 8c.

In the power cycle test, the constant current sources 41 to 46 respectively supply constant currents of approximately 1 mA to the IGBTs for test 21 to 26. In the IGBTs for test 21 to 26 driven by the constant currents, however, heat thereby generated is negligibly small, hardly affecting a test to change the temperature of the IGBTs by the heating and cooling plate 9 in the thermal cycle test.

A superimpose test using the power cycle test apparatus 1 is hereinafter described referring to FIGS. 3 to 7.

First, the power cycle test is described in 1), then, the thermal cycle test in 2), and the superimpose test in 3).

Before the test starts, characteristics of the IGBTs 21 to 26 of the power device for test 10 are measured. First, in order to measure the temperature characteristics of the IGBTs for test 21 to 26, the temperature of the heating and cooling plate 9 is changed by controlling the water temperature management unit 5 of the chiller 2 without the application of the stress current to the IGBTs 21 to 26. Then, the stress current is applied to the IGBTs 21 to 26, and temperatures thereof immediately after the current application are measured. Then, a temperature transient response is accordingly measured to determine the validity of test conditions of the power cycle test.

Then, the stress current value verified by measuring the temperature transient response and the stress current ON/OFF cycles are set in the apparatus.

1) Power Cycle Test

Figure 3:
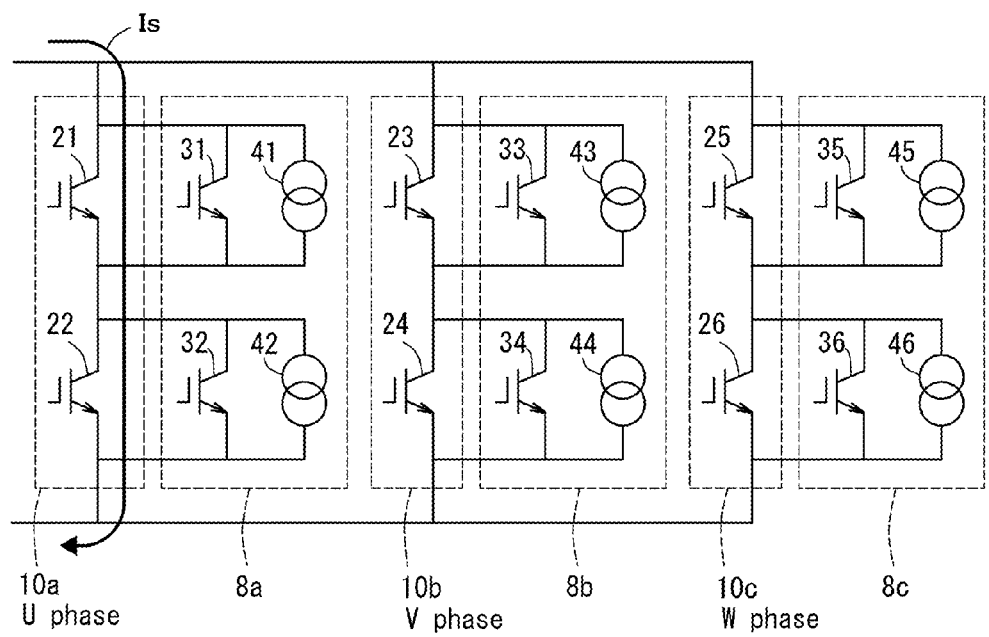
FIG. 3 illustrates a state where a stress current is being applied to the U-phase high-side and low-side IGBTs for test in the circuit connection diagram illustrated in FIG. 2.

In the power cycle test, as illustrated in FIG. 3, a stress current Is verified as described earlier is applied between the collector-emitter electrodes connected in series of the high-side IGBT for test 21 and the low-side IGBT for test 22 in the U-phase power device unit for test 10a. The ON/OFF cycles of the stress current Is are coincident with ON/OFF timings illustrated in FIG. 4b (ON at high level, OFF at low level). The ON/OFF cycles are set by applying a gate voltage Vg to gates of the IGBTs for test 21 and 22.

The stress current Is is sequentially applied to between the collector-emitter electrodes of the IGBTs 23 and 24 in the V-phase power device units for test 10b and to between the collector-emitter electrodes of the IGBTs 25 and 26 in the W-phase power device units for test 10c.

Figure 4A:
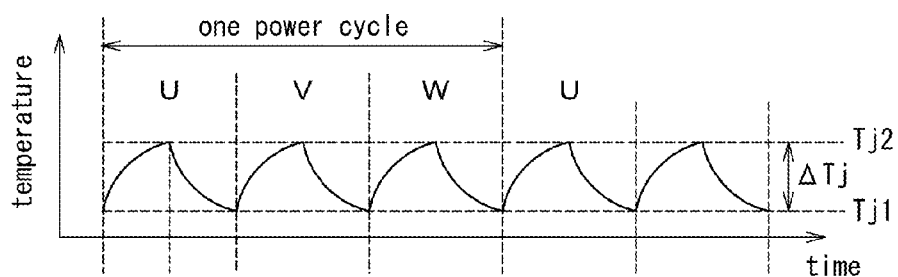
FIG. 4a is a graphical illustration of a junction temperature of the UVW three-phase IGBT for test during the power cycle test, where the longitudinal axis represents the junction temperature and the lateral axis represents time.
Figure 4B:
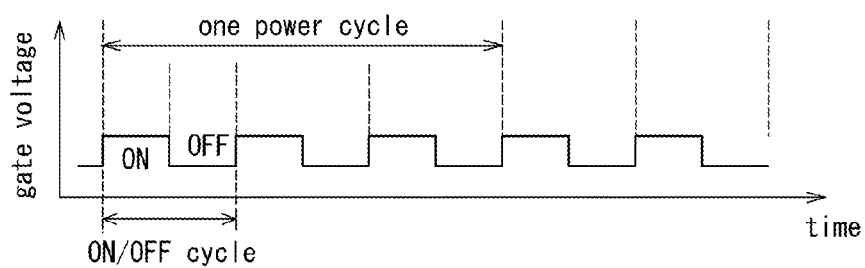
FIG. 4b is a graphical illustration of a gate voltage (ON/OFF timing) of the UVW three-phase IGBT for test during the power cycle test, where the longitudinal axis represents the gate voltage and the lateral axis represents time.

In the power cycle test performed by applying the stress current Is, a junction temperature Tj in the IGBTs for test 21 to 26 rises and falls between Tj1 and Tj2 as illustrated in FIG. 4a.

In FIG. 4a, ΔTj is a temperature difference between the rise and fall of the junction temperature Tj, and the period of one power cycle including the U, V, and W phases is illustrated.

Figure 5:
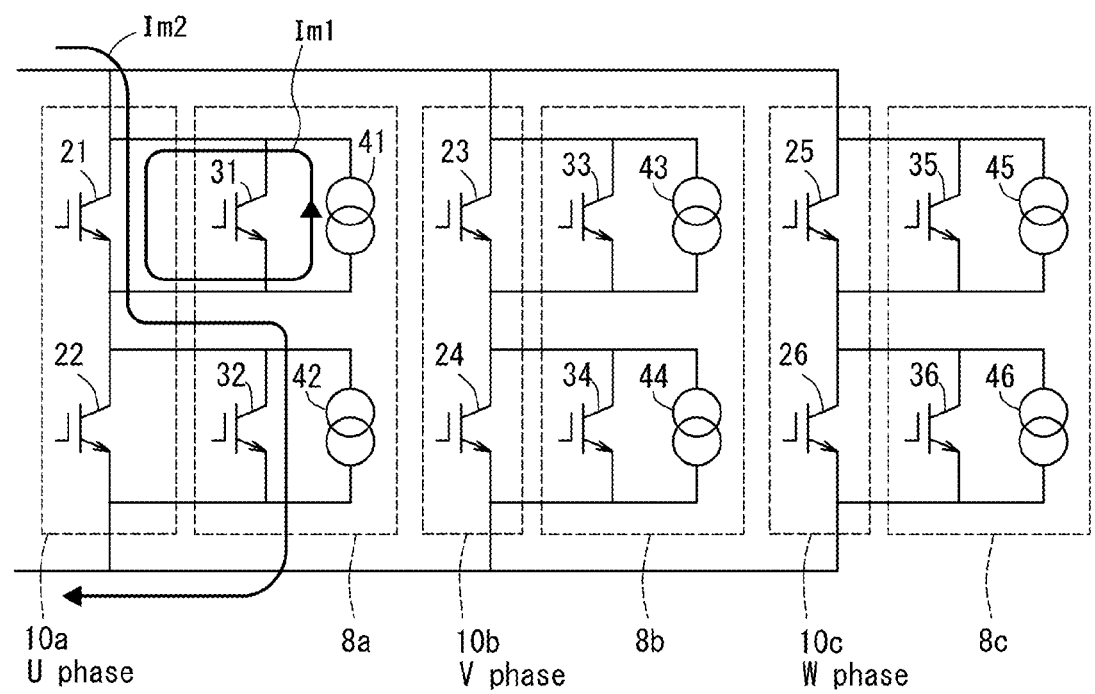
FIG. 5 is a circuit connection diagram similar to FIG. 2, illustrating a state where a measurement current is being applied from the constant current source to the U-phase high-side IGBT for test, and the stress current is being applied to the U-phase high-side IGBT for test and the low-side IGBT for control in the circuit connection diagram illustrated in FIG. 2.

After the power cycle test ends and the IGBTs for test 21 to 26 are cooled down, the U-phase IGBT for test 21 is turned on, and a first current for measurement Im1 is applied from the constant current source 41 to the IGBT for test 21 as illustrated with an arrow Im1 in FIG. 5.

The collector-emitter voltage Vce of the IGBT for test 21 at that time is measured.

The first current for measurement Im1 is similarly applied to the other V-phase and W-phase IGBTs for test 22 to 26 to thereby measure the collector-emitter voltages Vce of the respective IGBTs for test 22 to 26.

The collector-emitter voltage Vce thus measured corresponds to the junction temperature Tj1 when the junction temperatures of the IGBTs for test 21 to 26 are low.

Then, as illustrated with an arrow Im2 in FIG. 5, the IGBT for test 21 of the U-phase power device unit for test 10a and the IGBT for control 32 of the U-phase power device unit for control 8a are both turned on, and a second current for measurement Im2 (>the first current for measurement Im1) is applied between the collector and emitter of the IGBT for test 21 to increase the junction temperature Tj to the temperature Tj2 higher in a constant value than the junction temperature Tj1.

While the junction temperature Tj is still equal to the temperature Tj2 immediately after the second current for measurement Im2 is applied, the current to be applied to the IGBT for test 21 is switched to the first current for measurement Im1 from the constant current source 41, and the collector-emitter voltage Vce of the IGBT for test 21 at the time is measured. This process is similarly applied to the other IGBTs for test 22 to 26.

The power cycle test is performed in this manner for the UVW-phase IGBTs for test 21 to 26.

2) Thermal Cycle Test

In the thermal cycle test, the controller 11 controls the temperature of water in the water circulation pipe 6 by controlling the water temperature management unit 5 of the chiller 2 to thereby feed the heating and cooling plate 9 with the temperature-controlled water. The water temperature at the time corresponds to the temperature of an environment where the power device for test 10 having the IGBTs for test 21 to 26 is used. This water temperature changes in temperature rise-fall cycles illustrated in FIG. 6.

The power device for test 10 is mounted on the heating and cooling plate 9. The temperature of the heating and cooling plate 9 changes in temperature rise-fall cycles simulated from the temperature changes in the external environment illustrated in FIG. 6. To respond to the temperature changes, the power device for test 10 is heated or cooled down by the heating and cooling plate 9.

Figure 6:
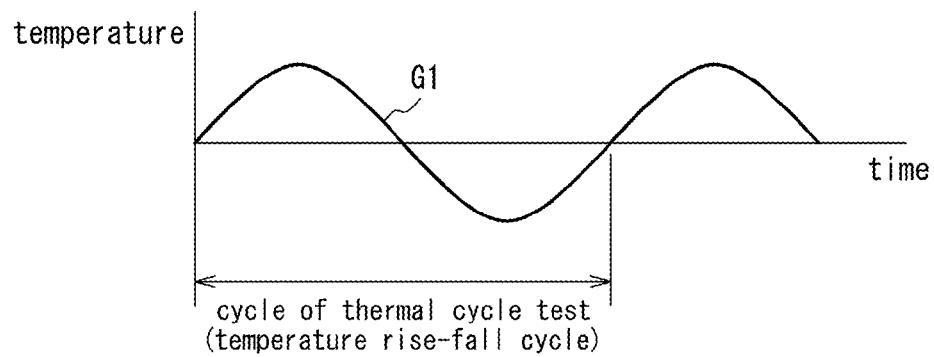
FIG. 6 is a graphical illustration of a thermal cycle test currently executed, where the longitudinal axis represents a heating temperature and the lateral axis represents time.

The cycles of the thermal cycle test illustrated in FIG. 6 are longer than the cycles of the power cycle test illustrated in FIG. 4a (ON/OFF cycles in the illustration of FIG. 4). For example, one cycle of the power cycle test has a length of about a few minutes, whereas one cycle of the thermal cycle test is a few times to some ten times longer than the cycle of the power cycle test. Though the cycles of the cycle tests are arbitrarily set, the thermal cycle has a longer period than the power cycle.

In the thermal cycle test, the stress current Is is not applied between the collector-emitter electrodes of the IGBTs for test 21 to 26 in the power device for test 10. Hence, self-heating does not occur in any of the IGBTs for test 21 to 26.

3) Superimpose Test

The superimpose test described in this specification is to execute the power cycle test in 1) and the thermal cycle test in 2) in synchronization with each other.

In the superimpose test, the controller 11 executes the power cycle test in 1) in synchronization with execution phases of the thermal cycle test in 2).

Figure 7:
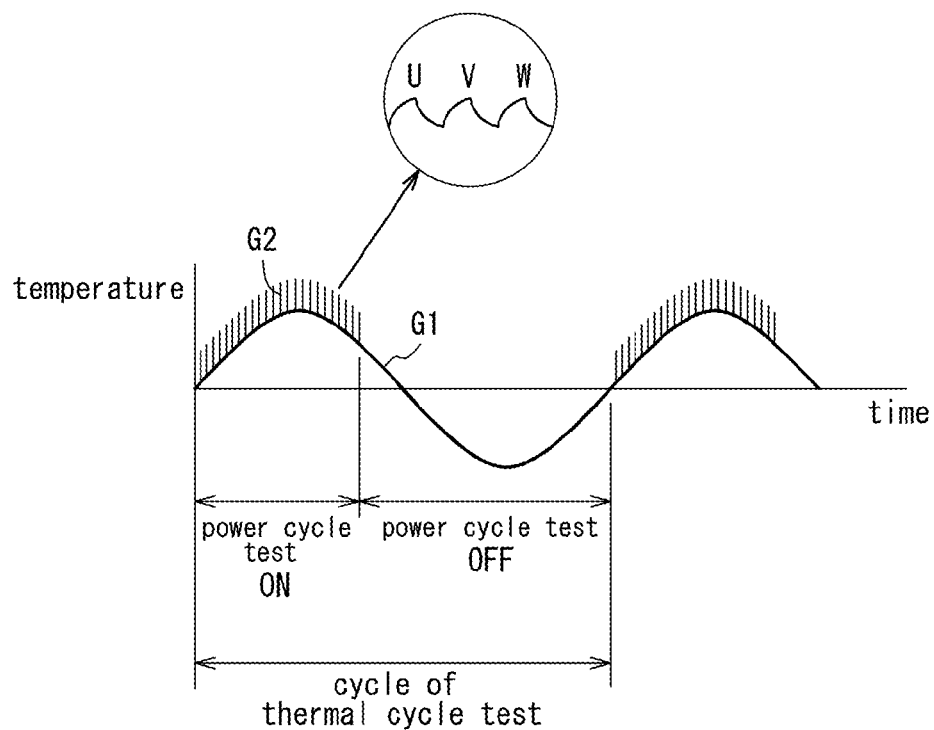
FIG. 7 is a graphical illustration where changes of an internal temperature of a power semiconductor device resulting from self-heating are superimposed on temperature changes in an external environment of the power semiconductor device when the power cycle test and the thermal cycle test are synchronously carried out.
Figure 8:
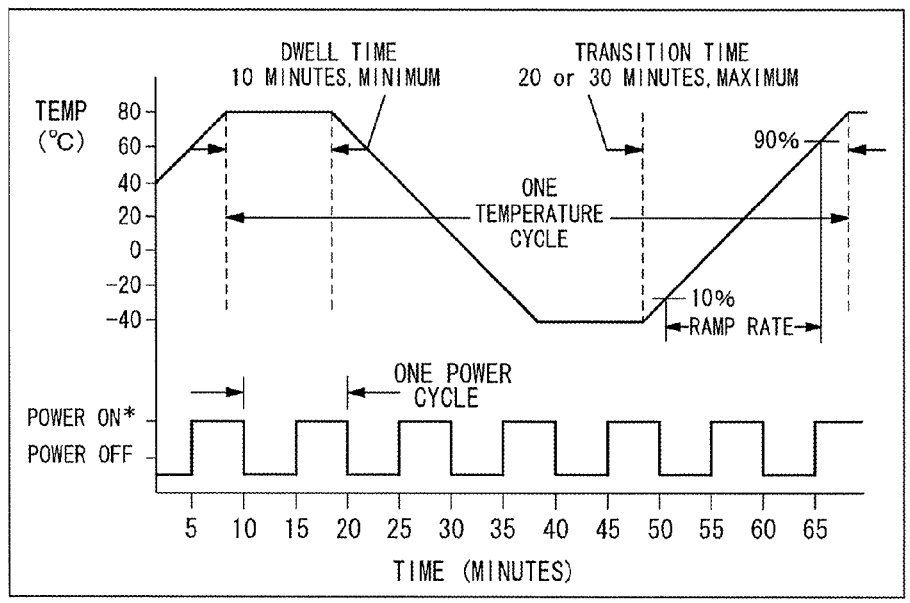
FIG. 8 is a graphical illustration of power cycles of a power source used in the power cycle test and thermal cycles by a thermal stress in the thermal cycle test.

The superimpose test is hereinafter described in detail referring to FIG. 7. FIG. 7 is a graphical illustration where internal temperature changes of the IGBTs for test 21 to 26 in the power device for test 10 owing to self-heating (FIG. 4a) are superimposed on temperature changes in an external environment of the power device for test 10 (FIG. 6) when the power cycle test and the thermal cycle test are synchronously carried out. In the illustration of FIG. 7, the lateral axis represents time, and the longitudinal axis represents test temperatures.

In the superimpose test, the controller 11 changes the temperature of the heating and cooling plate 9 in predefined cycles of the thermal cycle test in accordance with a temperature change pattern G1 illustrated in FIG. 7. The temperature change pattern G1 is a sine wave pattern.

The power cycle test is performed within a positive half cycle of one cycle in the thermal cycle test. Within a cycle shorter than the positive half cycle (ON period of the power cycle test in the drawing), the stress current Is is applied to the IGBTs for test 21 to 26 of the power device for test 10 in the cycles of the power cycle test illustrated in FIG. 4 (ON/OFF cycles).

On the temperature change pattern G1, temperature changes of the UVW-phase power device units for test 10a to 10c are shown with a temperature change pattern G2. The temperature change pattern G2 of the power cycle test is superimposed on the temperature change pattern G1 of the thermal cycle test.

A part of the illustration of FIG. 7 is enlarged and drawn in a circle, which illustrates wave patterns of the temperature changes of the UVW-phase power device units for test 10a to 10c in one power cycle of FIG. 4a. When the power cycle test is thus executed in accordance with the temperature change pattern G1, the power cycle test can be executed in synchronization with the execution phases of the thermal cycle test.

Thereby, the IGBTs for test 21 to 26 can be tested suitably for actual environments where these IGBTs are used.

Here the description of "executed in synchronization with the execution phases of the thermal cycle test" means that the power cycle test is executed in synchronization with the execution phases of the thermal cycle when the thermal cycle test is executed in the cycles corresponding to the sine wave pattern illustrated in FIG. 6 and the power cycle test is executed within, for example, a positive half cycle of the sine wave pattern.

In addition the description of "executed in synchronization with the execution phases of the thermal cycle test" means that the power cycle test is executed in synchronization with the execution phases of the thermal cycle test when the thermal cycle test is executed in the cycles corresponding to a step response wave pattern of ON/OFF duty 50% and the power cycle test is executed within the ON/OFF duty 50%.

The execution phases according to the embodiment are not necessarily limited to those illustrated in FIG. 7 but may be arbitrarily decided.

The power cycle test according to the embodiment is characterized in that a period of time when the stress current Is is applied to the IGBTs for test 21 to 26 within the power cycles and a period of time when the current application is suspended are fixed. The power cycle test, however, is not necessarily limited to such. The power cycle test may use, as a preset temperature value, a value of temperature rise defined based on a difference between upper-limit and lower-limit temperatures to be given to the junctions of the IGBTs for test 21 to 26 within the power cycles and continue to apply the stress current Is until the junction temperatures reach the preset temperature value.

Of the two tests to be executed, the controller 11 may prioritize the execution of the power cycle test over the execution of the thermal cycle test or prioritize the execution of the thermal cycle test over the execution of the power cycle test.

More specifically describing "prioritize" in this context, when the application of stress due to self-heating of the IGBTs for test 21 to 26 is the test object, meaning that the power cycle test is to be executed, the power cycle is defined as a primary test condition, and the thermal cycle is defined as a secondary test condition.

In the case where a temperature fall time to be completed within the thermal cycles needs not be followed due to self-heating in the IGBTs for test 21 to 26 in the power cycles, the temperature fall time is prolonged with a higher priority to the power cycles until the IGBTs are cooled down to the preset temperature value.

On the other hand, when the application of stress due to the external environment of the IGBTs for test 21 to 26 is the test object, meaning that the thermal cycle test is to be executed, the thermal cycle is defined as a primary test condition, and the power cycle is defined as a secondary test condition. For example, the external environmental temperature is changed, and the power cycle test is accordingly executed irrespective of any ongoing status of the junction temperature Tj in the IGBTs for test 21 to 26.

In the case where the temperature fall of the power device for test 10 takes more time in the power cycle test than the temperature fall time of the power device for test 10 defined in the thermal cycle test owing to heat storage in the power device for test 10, the execution of the thermal cycle test may be prioritized over the execution of the power cycle test.

In the case where the temperature of the power device for test 10 fails to reach the target heating temperature in the thermal cycle test within the cycles thereof owing to the capacity of the heating and cooling plate 9, for example, the heating is continued until the heating temperature is reached, and the thermal cycle test is temporarily stopped to start the cooling.

According to the embodiment, UVW-phase IGBTs with six circuit elements (6in1) are used as an example to be tested. As another embodiment, other UVW-phase IGBTs with one circuit element (2in1) may be used as an example to be tested.

According to the embodiment, the heating and cooling plate 9 is used as a device that causes temperature changes in the external environment of the IGBTs for test used as the power semiconductor devices to be tested. A heating plate and a cooling plate may be separately provided, or a heat source and a cold source may be used for heating and cooling in place of the heating and cooling plate.

According to the embodiment, the thermal cycle test is executed, and the power cycle test is further executed while the thermal cycle test is being executed in synchronization with the execution phases of the thermal cycle test. This enables to efficiently reproduce nearly a level of stress that may occur in failure mode in environments where the power device for test 10 is actually used, thereby succeeding in evaluating the IGBTs for test 21 to 26 with a high reliability.

DESCRIPTION OF REFERENCE NUMERALS 1 power cycle test apparatus
2 chiller
  5 water temperature management unit
  6 water circulation pipe
3 test unit
  7 current source
  8 power device for control
  9 heating and cooling plate
  10 power device for test
4 control rack
  11 controller
  12 gate timing unit
  13 voltage measuring unit
21-26 IGBT for test
31-36 IGBT for control
41-46 constant current source

The invention claimed is:

1. A power cycle test apparatus for performing a power cycle test for a power semiconductor device to be tested by applying a thermal stress to the power semiconductor device to be tested through the application of a stress current thereto in predefined ON/OFF cycles,
the apparatus comprising:
a current source for applying the current to the power semiconductor device to be tested;
a temperature changing device for changing a temperature in an external environment of the power semiconductor device to be tested; and
a controller for controlling the power cycle test apparatus, wherein
the controller executes a thermal cycle test in temperature rise-fall cycles longer than the ON/OFF cycles by using the temperature changing device, and
the controller further executes the power cycle test in synchronization with execution phases of the thermal cycle test while executing the thermal cycle test.

2. The power cycle test apparatus as claimed in claim 1, wherein
the power cycle test is a power cycle test in which a period of time when the stress current is applied to the power semiconductor device to be tested in the ON/OFF cycles of the power cycle test and a period of time when the current application is suspended are fixed.

3. The power cycle test apparatus as claimed in claim 1, wherein
the power cycle test is a power cycle test in which an upper-limit temperature value set based on a difference between upper-limit and lower-limit temperatures that should be applied to a junction in the power semiconductor device to be tested within the ON/OFF cycles of the power cycle test is used as a preset temperature value, and the stress current is applied until a junction temperature reaches the preset temperature value.

4. The power cycle test apparatus as claimed in claim 1, wherein
the controller controls the execution of the power cycle test to be prioritized over the execution of the thermal cycle test or controls the execution of the thermal cycle test to be prioritized over the execution of the power cycle test.

5. The power cycle test apparatus as claimed in claim 1, wherein
the controller controls the execution of the thermal cycle test to be prioritized over the execution of the power cycle test in the case where a fall of temperature of the power semiconductor device to be tested takes more time in the power cycle test than a temperature fall time of the power semiconductor device to be tested defined in the thermal cycle test owing to heat storage in the power semiconductor device to be tested.

6. The power cycle test apparatus as claimed in claim 1, wherein
in the case where a temperature of the power semiconductor device to be tested fails to reach a target heating temperature within the thermal cycles in the thermal cycle test owing to a capacity of the temperature changing device,
the controller temporarily stops further progression of the thermal cycles until the temperature reaches the target heating temperature.

7. A power cycle test method for performing a power cycle test for a power semiconductor device to be tested by applying a thermal stress to the power semiconductor device to be tested through the application of a stress current thereto in predefined ON/OFF cycles,
the method comprising:
a first step in which a thermal cycle test is executed in temperature rise-fall cycles longer than the ON/OFF cycles by using a temperature changing device for changing an external environmental temperature; and
a second step in which the power cycle test is executed in synchronization with execution phases of the thermal cycle test while the thermal cycle test is being executed.

8. The power cycle test method as claimed in claim 7, wherein
the power cycle test is a power cycle test in which a period of time when the stress current is applied to the power semiconductor device to be tested in the ON/OFF cycles of the power cycle test and a period of time when the current application is suspended are fixed.

9. The power cycle test method as claimed in claim 7, wherein
the power cycle test is a power cycle test in which an upper-limit temperature value set based on a difference between upper-limit and lower-limit temperatures that should be applied to a junction in the power semiconductor device to be tested within the ON/OFF cycles of the power cycle test is used as a preset temperature value, and
the stress current is applied until a junction temperature reaches the preset temperature value.

10. The power cycle test method as claimed in claim 7, wherein the execution of the power cycle test is controlled to be prioritized over the execution of the thermal cycle test or the execution of the thermal cycle test is controlled to be prioritized over the execution of the power cycle test.

11. The power cycle test method as claimed in claim 7, wherein the execution of the thermal cycle test is controlled to be prioritized over the execution of the power cycle test in the case where a fall of temperature of the power semiconductor device to be tested takes more time in the power cycle test than a temperature fall time of the power semiconductor device to be tested defined in the thermal cycle test owing to heat storage in the power semiconductor device to be tested.

12. The power cycle test method as claimed in claim 7, wherein in the case where a temperature of the power semiconductor device to be tested fails to reach a target heating temperature within the thermal cycles in the thermal cycle test owing to a capacity of the temperature changing device, further progression of the thermal cycles is temporarily stopped until the temperature reaches the target heating temperature.

\* \* \* \* \*